(12) United States Patent
Weng et al.

(10) Patent No.: US 12,136,613 B2
(45) Date of Patent: Nov. 5, 2024

(54) CHIP PACKAGE WITH NEAR-DIE INTEGRATED PASSIVE DEVICE

(71) Applicant: XILINX, INC., San Jose, CA (US)

(72) Inventors: Li-Sheng Weng, San Diego, CA (US); Suresh Ramalingam, Fremont, CA (US); Hong Shi, Los Gatos, CA (US)

(73) Assignee: XILINX, INC., San Jose, CA (US)

(*) Notice: Subject to any disclaimer, the term of this patent is extended or adjusted under 35 U.S.C. 154(b) by 279 days.

(21) Appl. No.: 17/669,252

(22) Filed: Feb. 10, 2022

(65) Prior Publication Data
US 2023/0253380 A1    Aug. 10, 2023

(51) Int. Cl.
*H01L 23/00* (2006.01)
*H01L 25/16* (2023.01)

(52) U.S. Cl.
CPC ............. *H01L 25/16* (2013.01); *H01L 24/24* (2013.01); *H01L 2224/24226* (2013.01); *H01L 2224/24265* (2013.01); *H01L 2224/244* (2013.01); *H01L 2924/19011* (2013.01); *H01L 2924/19041* (2013.01); *H01L 2924/19103* (2013.01)

(58) Field of Classification Search
CPC ................................ H01L 25/16; H01L 24/24
See application file for complete search history.

(56) References Cited

U.S. PATENT DOCUMENTS

| | | | |
|---|---|---|---|
| 8,227,904 B2 | 7/2012 | Braunisch et al. | |
| 9,633,977 B1* | 4/2017 | We ..................... | H01L 23/5387 |
| 11,694,940 B1* | 7/2023 | Mathuriya ........ | H01L 23/49816 |
| | | | 257/295 |
| 11,728,316 B2* | 8/2023 | Shih ................... | H01L 21/76898 |
| | | | 257/777 |
| 2010/0140779 A1* | 6/2010 | Lin .................... | H01L 23/49827 |
| | | | 257/690 |
| 2012/0153493 A1* | 6/2012 | Lee ......................... | H01L 24/24 |
| | | | 257/774 |
| 2012/0175732 A1* | 7/2012 | Lin ......................... | H01L 25/16 |
| | | | 438/109 |
| 2012/0261838 A1 | 10/2012 | Braunisch et al. | |
| 2012/0292738 A1* | 11/2012 | Lin ..................... | H01L 21/568 |
| | | | 257/532 |
| 2014/0035158 A1* | 2/2014 | Chang ..................... | H01L 24/08 |
| | | | 438/109 |
| 2014/0264791 A1 | 9/2014 | Manusharow et al. | |
| 2015/0011050 A1 | 1/2015 | Chiu et al. | |
| 2015/0069570 A1* | 3/2015 | Shih .................. | H01L 21/76805 |
| | | | 257/508 |
| 2015/0076710 A1* | 3/2015 | Chang ................. | H01L 25/50 |
| | | | 257/774 |
| 2016/0021754 A1* | 1/2016 | Chen ..................... | H01L 25/105 |
| | | | 29/841 |
| 2016/0056100 A1* | 2/2016 | Yeh ................... | H01L 23/49838 |
| | | | 257/676 |

(Continued)

*Primary Examiner* — Nathan W Ha
(74) *Attorney, Agent, or Firm* — Patterson + Sheridan, LLP

(57) ABSTRACT

A chip package and method for fabricating the same are provided that includes a near-die integrated passive device. The near-die integrated passive device is disposed between a package substrate and an integrated circuit die of a chip package. Some non-exhaustive examples of an integrated passive device that may be disposed between the package substrate and the integrated circuit die include a resistor, a capacitor, an inductor, a coil, a balum, or an impedance matching element, among others.

20 Claims, 5 Drawing Sheets

(56) References Cited

U.S. PATENT DOCUMENTS

| | | | | |
|---|---|---|---|---|
| 2016/0276307 A1* | 9/2016 | Lin | ............... | H01L 23/562 |
| 2016/0315066 A1* | 10/2016 | Yeh | ............... | H01L 23/3114 |
| 2017/0018497 A1* | 1/2017 | Zhai | ............... | H01L 21/4846 |
| 2019/0088621 A1* | 3/2019 | Yang | ............... | H01L 23/5385 |
| 2021/0175181 A1* | 6/2021 | Kim | ............... | H01L 23/552 |
| 2021/0305228 A1* | 9/2021 | Yang | ............... | H01L 23/49816 |
| 2021/0343684 A1* | 11/2021 | Kim | ............... | H01L 24/13 |
| 2021/0351145 A1* | 11/2021 | Patil | ............... | H01L 24/19 |
| 2021/0398957 A1* | 12/2021 | Lan | ............... | H01L 25/162 |
| 2022/0052024 A1* | 2/2022 | Lu | ............... | H01L 25/50 |
| 2022/0139863 A1* | 5/2022 | Song | ............... | H01L 24/24 |
| | | | | 257/401 |
| 2022/0179437 A1* | 6/2022 | Lee | ............... | H02M 3/04 |
| 2022/0302003 A1* | 9/2022 | Pan | ............... | H01L 21/4857 |
| 2023/0063304 A1* | 3/2023 | Liu | ............... | H01L 23/145 |
| 2023/0119525 A1* | 4/2023 | Foo | ............... | H01L 23/49827 |
| | | | | 257/668 |
| 2023/0140748 A1* | 5/2023 | Lee | ............... | H01L 21/56 |
| | | | | 361/761 |
| 2023/0207471 A1* | 6/2023 | Mallik | ............... | H01L 25/0657 |
| | | | | 257/734 |
| 2023/0207546 A1* | 6/2023 | Alam | ............... | H01L 25/50 |
| | | | | 257/737 |

* cited by examiner

CHIP PACKAGE WITH NEAR-DIE INTEGRATED PASSIVE DEVICE

TECHNICAL FIELD

Embodiments of the present invention generally relate to a chip package having a near-die integrated passive device, and in particular, to a chip package having an integrated passive device disposed between a redistribution layer and an integrated circuit die of the chip package.

BACKGROUND

Electronic devices, such as tablets, computers, copiers, digital cameras, smart phones, control systems, automated teller machines, data centers, artificial intelligence system, and machine learning systems among others, often employ electronic components which leverage chip package assemblies for increased functionality and higher component density. Conventional chip packaging schemes often utilize a package substrate, often in conjunction with a through-silicon-via (TSV) interposer substrate, to enable a plurality of integrated circuit (IC) dies to be mounted to a single package substrate. The IC dies are mounted to a die side (i.e., top surface) of the package substrate while a ball side (i.e., bottom surface) of the package substrate is mounted to a printed circuit board (PCB). The IC dies may include memory, logic or other IC devices.

Decoupling capacitors are often used in chip packages to provide stable power to the circuitry of the IC dies utilized in the chip package. Conventionally, decoupling capacitors are mounted on the top and/or bottom surface of the package substrate. However at high frequencies, power and ground routings with the package substrate can impact the functional performance of the IC dies of the chip package due to its intrinsic inductance and resistance which detrimentally effect decoupling efficiency, and ultimately, the performance of the power delivery network. Instability of the power delivery network consequently diminishes the performance of IC dies of the chip package.

Therefore, a need exists for a chip package with improved capacitive decoupling in power delivery networks.

SUMMARY

A chip package and method for fabricating the same are provided that includes a near-die integrated passive device. The near-die integrated passive device is disposed between a package substrate and an integrated circuit die of a chip package. Some non-exhaustive examples of an integrated passive device that may be disposed between the package substrate and the integrated circuit die include a resistor, a capacitor, an inductor, a coil, a balum, or an impedance matching element, among others.

In one example, a chip package is provided that includes an integrated circuit (IC) die, a package substrate, an integrated passive device (IPD) layer, a dielectric interconnection layer, and an integrated passive device (IPD). The package substrate includes a die side and a ball side. The package substrate has build-up layers disposed on a core. Package circuitry includes routings terminating on the top and bottom surfaces of the package substrate, the routing passing through the build-up layers and core. The IPD layer includes conductive posts coupled to pillars extending below the IC die. The dielectric interconnection layer is disposed between the IC die and the build-up layers. The dielectric interconnection layer includes pillars posts coupled to the conductive posts of the IPD layer. The IPD is disposed between the IC die and the package substrate. The IPD has at least one terminal electrically coupled to the IC die.

In another example, a chip package is provided that includes an integrated circuit (IC) die, a package substrate, an integrated passive device (IPD) layer, a dielectric interconnection layer, and an integrated passive device (IPD). Package circuitry includes routings terminating on the top and bottom surfaces of the package substrate, the routing passing through the build-up layers and core. The IPD layer includes conductive posts coupled to pillars extending below the IC die. The dielectric interconnection layer is disposed between the IC die and the build-up layers. The dielectric interconnection layer includes conductive pillars coupled to the conductive posts of the IPD layer. The IPD is disposed between the IC die and the package substrate. The IPD is a capacitor that has a first terminal coupled to circuitry of the IC die and a second terminal coupled to the circuitry of the IC die.

In another example, the first terminal of the capacitor is coupled to power delivery circuitry of the IC die and the second terminal of the capacitor is coupled to the ground circuitry of the IC die.

The capacitor may be coupled directly to circuitry of the IC die. Alternatively, the capacitor may be coupled to circuitry of the IC die through conductive posts of the IPD layer.

In yet another example, a method for fabricating a chip package is provided. The method includes sandwiching an integrated passive device (IPD) between an integrated circuit (IC) die and an IPD layer; and stacking the IPD layer with a package substrate. The method defines power supply circuitry from circuitry of the package substrate, through conductive posts of the IPD layer, to circuitry of the IC die. The method also defines ground circuitry from the circuitry of the package substrate, through conductive posts of the IPD layer, to the circuitry of the IC die. The method also couples the IPD to the power supply circuitry and the ground circuitry though the circuitry of the IC die, or through the conductive posts of the IPD layer.

In one example, the method includes forming a plurality of dummy posts between the IPD and the package substrate.

In another example, the method includes connecting the IPD to the IC die prior to connecting the IPD layer to the IC die.

In another example, the method includes connecting the IPD to the IC die after connecting the IPD layer to the IC die.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

Disclosed herein is a chip package and method for fabricating the same that includes a near-die integrated passive device. The near-die integrated passive device is disposed between a package substrate and an integrated circuit (IC) die of a chip package. Positioning the integrated passive device on the IC die side of the chip package places the integrated passive device much closer to the IC die as compared to conventional designs. In that manner, communication speeds and reliability improve. Additionally, parasitic losses that occur in conventional routing of the integrated passive device to the IC die through the package substrate are beneficially eliminated.

In an example using a decoupling capacitor as the integrated passive device disposed between the package substrate and the IC die, the loop inductance between the decoupling capacitor and the IC die may improve by 8 or more percent. In some example, the loop inductance improved in excess of 30 percent. Additionally, significant improvements in the AC droop are also realized.

Beneficially, the configuration and techniques described above and further detailed below provide robust chip package with improved performance and reliability. Furthermore, the techniques described herein may be employed with little cost impact to the fabrication and assembly of the chip package.

Figure 1A:
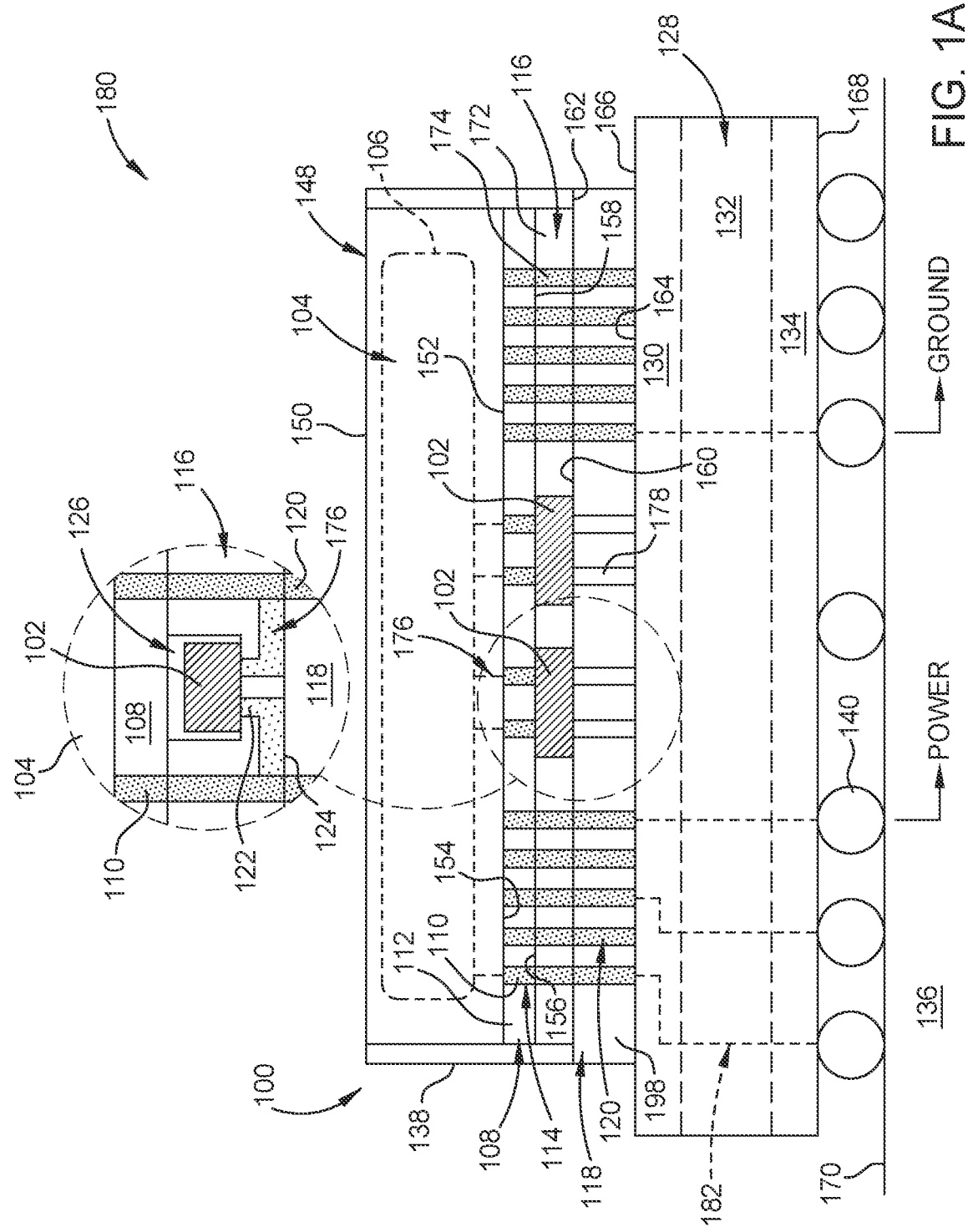
FIG. 1A is a schematic sectional view of a chip package having an integrated passive device (IPD) disposed between an integrated circuit (IC) die and a a package substrate.

Turning now to FIG. 1A, a schematic sectional view of a chip package 100 is illustrated. The chip package 100 includes an integrated passive device (IPD) 102, at least one integrated circuit (IC) die 104, an integrated passive device (IPD) layer 116, a dielectric interconnection layer 118 and a package substrate 128. The dielectric interconnection layer 118 and IPD layer 116 are disposed between the package substrate 128 and the IC die 104, and facilitates data, power and ground communication therebetween. The IC die 104 is disposed on the IPD layer 116, and the IPD layer 116 is disposed on the package substrate 128. An under die layer 108 is disposed between the IC die 104 and the IPD layer 116, and includes pillars 110 for making electrical connection therebetween. The dielectric interconnection layer 118 is disposed between the IPD layer 116 and the package substrate 128, and includes pillars 120 for making electrical connection therebetween. The chip package 100 may be mounted on a printed circuit board (PCB) 136 to form an electronic device 180.

The IPD 102 is disposed in the IPD layer 116 between the IC die 104 and the dielectric interconnection layer 118, thus making the IPD 102 near the IC die 104 rather than beginning electrically separated from the IC die 104 by the package substrate 128 as found in conventional designs. Stated differently, the IPD 102 is disposed in the IPD layer 116 between the IC die 104 and the closest fanout of electrical routing residing in the package substrate 120 or other layer disposed between the IPD 102 and package substrate 120, such as a redistribution layer or the like. Thus making the IPD 102 near the IC die 104 rather than beginning electrically separated from the IC die 104 by a routing fanout.

The IPD 102 is a discrete, pre-formed device that is fully fabricated prior to attachment directly to the IC die 104 or indirectly to the IC die 104 through to the IPD layer 116 and/or dielectric interconnection layer 118. Some non-exhaustive examples of an IPD 102 that may be disposed between the dielectric interconnection layer 118 and the IC die 104 include a resistor, a capacitor, an inductor, a coil, a balum, or an impedance matching element, among others. Although in the example described with reference to FIG. 1A through FIG. 3 below the IPD 102 is described as a decoupling capacitor, other types of IPDs may be utilized in the chip package 100.

Continuing to refer to FIG. 1A, the IC die 104 of the chip package 100 includes die circuitry 106. The die circuitry 166 may include block random access memory (BRAM), Ultra-RAM (URAM), digital signal processing (DSP) blocks, configurable logic elements (CLEs), and the like. The IC die 104 may be, but is not limited to, programmable logic devices, such as field programmable gate arrays (FPGA), memory devices, such as high band-width memory (HBM), optical devices, processors or other IC logic structures. The IC die 104 may optionally include optical devices such as photo-detectors, lasers, optical sources, and the like. In the example of FIG. 1A, the IC die 104 is a logic die having math processor (also known as math engine) circuitry for accelerating machine-learning math operations in hardware, such as self-driving cars, artificial intelligence and data-center neural-network applications.

Optionally, the at least one IC die 104 may be a plurality of IC dies 104. When a plurality of IC dies 104 are utilized, the IC dies 104 may be disposed in a vertical stack and/or disposed laterally side by side. It is contemplated that the IC dies 104 comprising the plurality of IC dies 104 may be the same or different types. Although only one IC die 104 is shown in FIG. 1A, the number of IC dies 104 disposed in the chip package 100 may vary from one to as many as can fit within the chip package 100.

The IC die 104 includes a die body 148 having a die bottom surface 152 and a die top surface 150. The die circuitry 106 is disposed within the die body and includes routing that terminates on the die bottom surface 152 of the IC die 104, for example at contact pads.

Pillars 110 are formed on the contact pads exposed on the die bottom surface 152 of the IC die 104. The pillars 110 are mechanically and electrically connected to conductive posts 174 formed in the IPD layer 116. At an appropriate time during fabrication of the chip package 100, the interstitial space around the pillars 110 may be filled with an underfill material 112. The underfill material 112 as a top surface 154 in contact with the die bottom surface 152 of the IC die 104 and a bottom surface 156 bounded by the IPD layer 116. Together, the pillars 110 and the underfill material 112 form the under die layer 108. Generally, the pillars 110 are formed on the IC die 104 prior to connecting the IC die 104 with the IPD layer 116, while the underfill material 112 is disposed around the pillars 110 at a later fabrication step. The pillars 110 form interconnect circuitry 114 of the under die layer 108 that connect the die circuitry 106 and the conductive posts 174 of the IPD layer 116.

In one example, the pillars 110 are formed by plating copper on the conductive contact pads formed on the die bottom surface 152 of the IC die 104. In other example, the pillars 110 may be formed using other suitable conductive material. The pillars 110 are also exposed through the bottom underfill surface 156 of under die layer 108 and are in contact with the conductive posts 174 exposed through the a top surface 158 of the IPD layer 116 that surrounds the IPD 102. Optionally, die level mold compound 138 may be disposed on the sides to the IC die 102, the interconnect layer 110 and the IPD layer 116, to enhance securing of the IC die 104 within the chip package 100 and to facilitate handling during fabrication.

The IPD layer 116 includes the top surface 158 and a bottom surface 160. The IPD layer 116 includes a plurality of conductive posts 174 disposed in a dielectric material 172. The dielectric material 172 may be polyimide or other suitable polymer. The conductive posts 174 may be plated metal, such as copper, a metal filled or coated via, solder paste or other electrically conductive material suitable for signal transmission. The conductive posts 174 may be disposed in a hole formed through the dielectric material 172, or alternatively, the conductive posts 174 may be formed on the pillars 110 then subsequently surrounded by the dielectric material 172. The conductive posts 174 are formed through the IPD layer 116 and connect the pillars 110 of the under die layer 108 to the pillars 120 of the dielectric interconnection layer 118. The dielectric material 172 also surrounds the IPD 102 to help secure the IPD 102 to the under die layer 108 and/or the IC die 104. The bottom surface 160 of the dielectric material 172 may be planarized or be made flat to provide a good mounting surface for the dielectric interconnection layer 118.

The dielectric interconnection layer 118 includes a plurality of conductive pillars 120 which form the circuitry of the interconnection layer 118. In one example, each pillar 120 is plated or otherwise formed on a respective one of the conductive posts 174. The pillars 120 are separated by a dielectric material, such as with underfill material 198. The pillars 120 and underfill material 198 form the dielectric interconnection layer 118. The pillars 120 are coupled through the DL top surface 162 of the dielectric interconnection layer 118 to the conductive posts 174 of the IPD layer 116, which in turn are coupled to the pillars 110 extending from the IC die 104. The pillars 120 are also coupled through a dielectric layer (DL) bottom surface 164 of the dielectric interconnection layer 118 to package circuitry 182 formed in the package substrate 128.

In one example, the connected pillars 110, pillars 120 and posts 174 are linearly aligned such that the electrical routings of the formed by the respectively coupled pillars 110, 120, and posts 174 passes essentially straight (i.e., linearly) from the package substrate 128 to the IC die 104 in a direction perpendicular to the top and bottom surfaces 162, 164 of the dielectric interconnection layer 118. Moreover, the coupled pillars 110, 120, and posts 174 are closer to the IC die 104 than any fanout of routing below the IPD 102 within the chip package 100, such as fanouts within the package substrate 128 or redistribution layer (190 shown in FIG. 1B). In such an example, the routing through the pillars 110, 120, and posts 174 has minimal resistance and parasitic inductance, thus enhancing the performance of the chip package 100.

Figure 3:
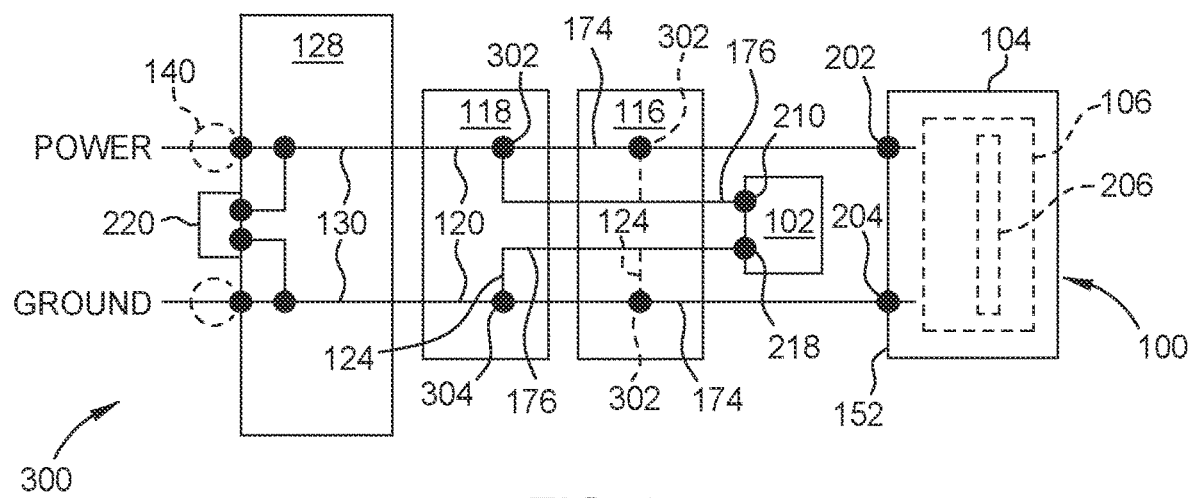
FIG. 3 is a schematic circuit diagram of a chip package illustrating another example of the connections between an integrated passive device (IPD), an integrated circuit (IC) die, and a package substrate.

In the main example depicted in FIG. 1A, the IPD 102 is disposed between the DL top surface 162 of the dielectric interconnection layer 118 and bottom of the pillars 110 extending from the IC die 104. In the enlarged detail depicted in depicted in FIG. 1A, the IPD layer 116 includes a space 126 in which at least a portion of the IPD 102 resides. For example, a portion of the IPD 102 may be overlapped with the dielectric interconnection layer 118 and/or under die layer 108, in addition to being overlapped with the IPD layer 116. In other examples, the IPD 102 is disposed completely within the space 126, such that the IPD 102 is completely overlapped by the IPD layer 116. In the enlarged example, IPD routing 176 defined between the IPD 102 and the IC die 104 may be optionally formed using a conductive post 122, terminating at that IPD 102, that is coupled by a conductive jumper 124 to one of the conductive posts 174 residing in the IPD layer 116. Alternatively, the conductive jumpers 124 may reside in the dielectric interconnection layer 118 (as illustrated in FIG. 3).

The space 126 may be a break in the IPD layer 116 such that there is nothing filling the space 126 between the dielectric interconnection layer 118 and under die layer 108 except for the IPD 102. In other examples, a portion of the dielectric material forming the dielectric interconnection layer 118 is missing proximate the DL top surface 162 such that the space 126 is formed at least partially in the dielectric interconnection layer 118. The space 126 may also be filled with a potting compound to secure the IPD 102 in the space 126.

Optionally, dummy posts 178 may be disposed in the dielectric interconnection layer 118 between the IPD 102 and the package substrate 128. The dummy posts 178 are spaced commensurate with the other conductive posts 174 of the dielectric interconnection layer 118 to balance the amount of metal across the width of the dielectric interconnection layer 118 and chip package 100 which mitigates warpage and distortion. The dummy posts 178 may be fabricated as described above with reference to the conductive posts 174. In one example, some or all of the dummy posts 178 are floating in that there is no signal, power or ground connection through the dummy posts 178 to the IPD 102. In yet another example, the dummy posts 178 are grounded. In another example, one or more of the conductive posts 174 may be disposed in the dielectric interconnection layer 118 between the IPD 102 and the package substrate 128 to provide one or more of signal, power or ground connection directly to the IPD 102 from the package substrate 128.

The DL bottom surface 164 of the dielectric interconnection layer 118 is disposed on a package top surface 166 of the package substrate 128. The pillars 120 are exposed to the DL bottom surface 164 such that the pillars 120 may be electrically coupled to the package circuitry 182 terminating at a package top surface 166 of the package substrate 128. In this manner, the pillars 120 are electrically coupled to and communicates with the package circuitry 182 of the package substrate 128.

Figure 1B:
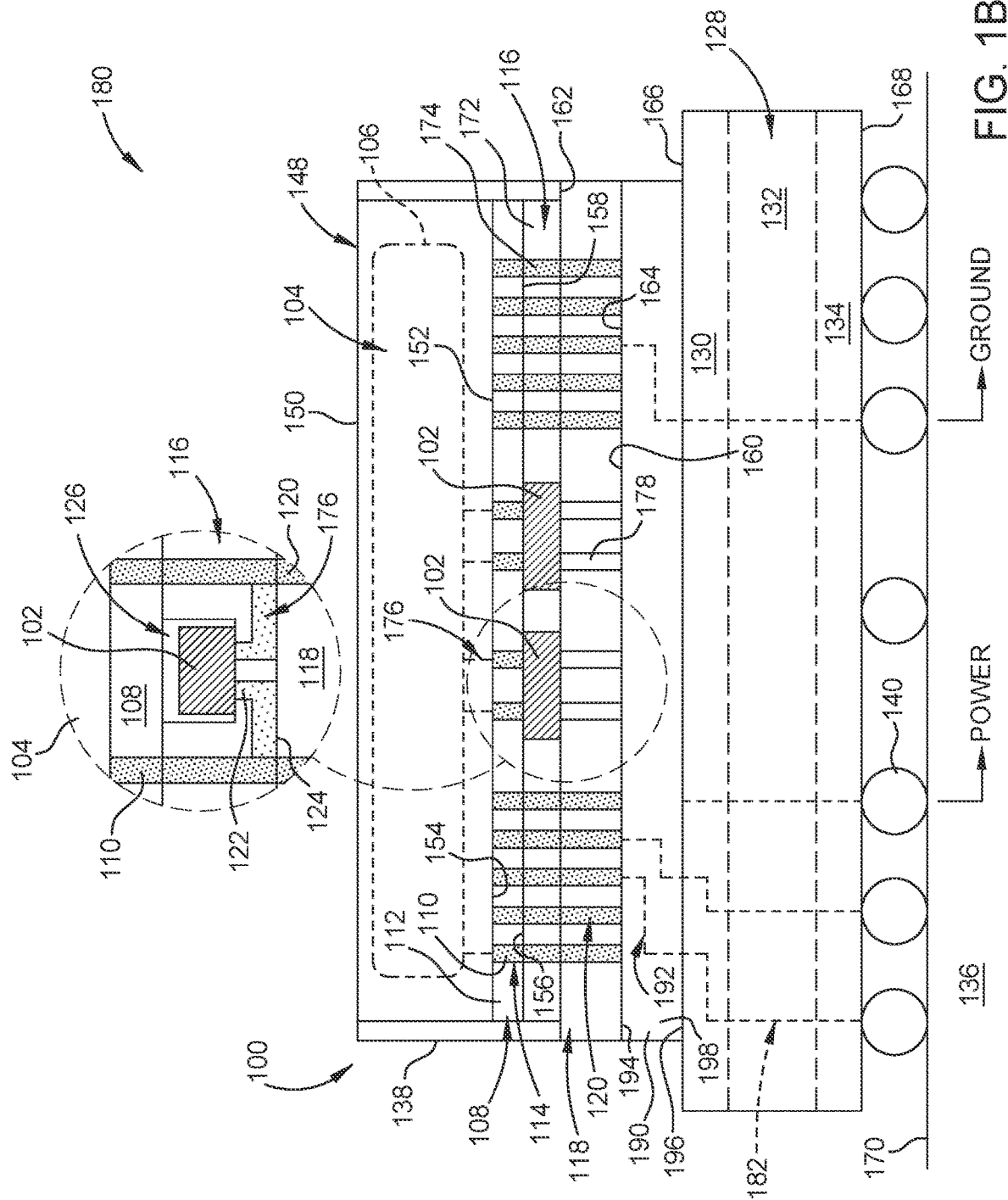
FIG. 1B is a schematic sectional view of a chip package having an integrated passive device (IPD) disposed between an integrated circuit (IC) die and a redistribution layer (RDL).

Alternatively as depicted in FIG. 1B, a redistribution layer (RDL) 190 may be disposed between the DL bottom surface 164 of the dielectric interconnection layer 118 and the package top surface 166 of the package substrate 128. The chip packages 100 depicted in FIG. 1A and FIG. 1B are essentially identical except for the presence of the RDL 190. The pillars 120 are electrically coupled to the package top surface 166 of the package substrate 128 by RDL circuitry 192 formed in the RDL 190.

The RDL 190 includes a plurality of conductive layers and vias which are patterned to form the RDL circuitry 192. The conductive layers and vias are separated by dielectric layers. There can be between two to seven patterned conductive layers forming the RDL circuitry 192. The RDL circuitry 192 couples the pillars 120 formed through the dielectric interconnection layer 118 to the package circuitry 182 formed in the package substrate 128.

In one example, the plurality of conductive layers and vias are patterned such that the routings of the RDL circuitry 192 fans out in a direction perpendicular to the RDL top and bottom surfaces 194, 196 of the RDL 190.

Returning back to FIG. 1A, the package substrate 128 generally includes at least an upper build up layer 130 disposed on a core 132. Optionally, a lower build up layer 134 may be disposed on the other side of the core 132 from the upper build up layer 130. The upper build up layer 130 includes a plurality of conductive layers and via that are patterned to provide routing of a portion of the package circuitry 182. One end of the package circuitry 182 formed in the upper build up layer 130 terminates at the package top surface 166 where the package circuitry 182 connects to the pillars 120 of the dielectric interconnection layer 118. The other end of the package circuitry 182 formed in the upper build up layer 130 terminates at vias formed through the core 132. The lower build up layer 134 may be fabricated similar to the upper build up layer 130. At least one of the upper and lower build up layers 130, 134 includes a fanout in the circuitry 182 of the package substrate 128.

In examples where the package substrate 128 does not include a lower build up layer 134, the vias formed through the core 132 of the package circuitry 182 may be connected by solder balls 140 to circuitry 142 of the PCB 136 that terminates at a PCB top surface 170 of the PCB 136. In examples having a lower build up layer 134, the vias formed through the core 132 are coupled through the patterned conductive layers and vias of lower build up layer 134 such that the package circuitry 182 terminates at a package bottom surface 168. At the package bottom surface 168, the package circuitry 182 is coupled to the circuitry 142 of the PCB 136 by the solder balls 140.

Thus, routing is formed through the chip package 100 that allows the circuitry 142 of the PCB 136 to communicate with the die circuitry 106 of the IC die 104. The routings allow power, ground and date to be communicated between the IC die 104 and the PCB 136. The routings generally provide an electrically conductive path through the package circuitry 182, the pillars 120 of the dielectric interconnection layer 118, the conductive posts 174 of the interconnect circuitry 114, and the pillars 110 coupled to the die circuitry 106 of the IC die 104. The pillars 120 of the dielectric interconnection layer 118, the conductive posts 174 of the interconnect circuitry 114, and the pillars 110 are linearly aligned for fast signal transmission and low power loss. The configuration of the IPD layer 116 and dielectric interconnection layer 118 allow the IPD 102 to be located near the IC die 104 relative routing fanouts within the chip package 100 (that are not within the IC die 104). Some of the routings include the IPD routing 176. In some instance, the IPD routings 176 extend directly from the IPD 102 and the die circuitry 106 of the IC die 104 without passing through the dielectric interconnection layer 118. In other examples, the IPD routings 176 extend directly between the IPD 102 and at least one or both of the pillars 120 of the dielectric interconnection layer 118 or the conductive posts 174 of the IPD layer 116. In some examples such as when the IPD 102 is configured as a decoupling capacitor, the IPD routings 176 extend directly between the IPD 102 and pillars 120 of the dielectric interconnection layer 118 such that the IPD 102 is coupled in parallel to the die circuitry 106 of the IC die 104. Exemplary circuit diagrams illustrating some of these examples are provided below with reference to FIGS. 2 and 3.

Figure 2:
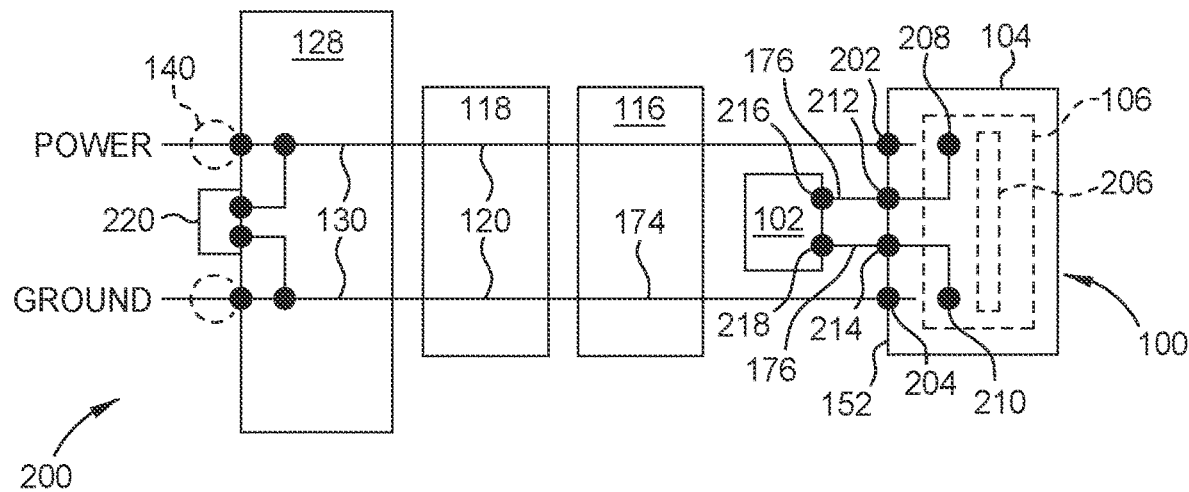
FIG. 2 is a schematic circuit diagram of a chip package illustrating one example of the connections between an integrated passive device (IPD), an integrated circuit (IC) die, and a package substrate.

FIG. 2 is a schematic circuit diagram 200 of a chip package 100 illustrating one example of the connections between an integrated passive device (IPD) 102, an integrated circuit (IC) die 104, an integrated passive device (IPD) layer 116, a dielectric interconnection layer 118 and a package substrate 128. The chip package 100 may be configured as described above, or have another configuration that includes the IPD 102 disposed between the dielectric interconnection layer 118 and the IC die 104. Although in the example depicted in FIG. 2, the IPD 102 is illustrated as a decoupling capacitor disposed in a power delivery network, the IPD 102 may be configured as another type of passive device.

As depicted in FIG. 2, power (PWR) and ground (GND) are coupled to the package circuitry 182 of the package substrate 128 from the PCB 136 through solder balls 140. The PCB 136 is not illustrated in FIG. 2, and the solder balls 140 are shown with dashed lines.

PWR is connected to a die power contact pad 204 through the pillars 110, 120 formed in the under die layer 108 and the dielectric interconnection layer 118, and the conductive posts 174 formed in the IPD layer 116. Similarly, GND is connected to a ground power contact pad 204 through the pillars 110, 120 formed in the under die layer 108 and the dielectric interconnection layer 118, and the conductive posts 174 formed in the IPD layer 116. As described above, the routing through each interconnected set of pillars 110, 120 and posts 110 is linear (i.e., straight and aligned). The die power contact pad 204 and the ground power contact pad 204 are formed on the die bottom surface 152 of the IC die 104, and coupled to functional circuitry 206 residing in the die circuitry 106 of the IC die 104. The functional circuitry 206 is the circuitry of the IC die 104 that carries out the function of the die. For example, the functional circuitry 206 may be logic circuits, memory circuits or other functional circuit.

A power node 208 is defined in the die circuitry 106 within the die body 148. The power node 208 is coupled to the die power contact pad 202, the functional circuitry 206 and a power die-IPD contact pad 212. The power die-IPD contact pad 212 is also formed on the die bottom surface 152 of the IC die 104. The power die-IPD contact pad 212 is coupled to an IPD power terminal 216 formed on the IPD 102.

Similarly, a ground node 210 is defined in the die circuitry 106 within the die body 148. The ground node 210 is coupled to the die ground contact pad 204, the functional circuitry 206 and a ground die-IPD contact pad 214. The ground die-IPD contact pad 214 is also formed on the die bottom surface 152 of the IC die 104. The ground die-IPD contact pad 214 is coupled to an IPD ground terminal 218 formed on the IPD 102.

In the example depicted in FIG. 2, the IPD power and ground terminals 216, 218 are coupled to opposite plates forming the decoupled capacitor of the IPD 102. The IPD power and ground terminals 216, 218 are coupled in parallel to the functional circuitry 206 of the IC die 104. Thus, the IPD 102 functions to provide voltage stable power to the functional circuitry 206 of the IC die 104. Additionally, as the IPD 102 is immediately proximate the IC die 104, and connected to the functional circuitry 206 of the IC die 104 without having to be routed through the circuitry 182 of the package substrate 128, the performance of the IC die 104 is enhanced.

Optionally, one or more decoupling capacitors 220 may be coupled to the top and/or bottom of the package substrate 128. The decoupling capacitor 220 is coupled on parallel with IPD power and ground terminals 216, 218 to the functional circuitry 206 of the IC die 104.

FIG. 3 is a schematic circuit diagram 300 of a chip package 100 illustrating another example of the connections between an integrated passive device (IPD) 102, an integrated circuit (IC) die 104, an integrated passive device (IPD) layer 116, an integrated passive device (IPD) layer 118 and a package substrate 128. The chip package 100 may be configured as described above, or have another configuration that includes the IPD 102 disposed between the dielectric interconnection layer 118 and the IC die 104. Although in the example depicted in FIG. 3, the IPD 102 is again illustrated as a decoupling capacitor disposed in a power delivery network, the IPD 102 may be configured as another type of passive device.

As depicted similarly in FIG. 2, power (PWR) and ground (GND) are coupled to the package circuitry 182 of the package substrate 128 from the PCB 136 through solder balls 140. The PCB 136 is not illustrated in FIG. 3, and the solder balls 140 are shown with dashed lines.

PWR is connected to a die power contact pad 204 through the pillars 110, 120 formed in the under die layer 108 and the dielectric interconnection layer 118, and the conductive posts 174 formed in the IPD layer 116. Similarly, GND is connected to a ground power contact pad 204 through the pillars 110, 120 formed in the under die layer 108 and the dielectric interconnection layer 118, and the conductive posts 174 formed in the IPD layer 116. As described above, the routing through each interconnected set of pillars 110, 120 and posts 110 is linear (i.e., straight and aligned). The die power contact pad 204 and the ground power contact pad 204 are formed on the die bottom surface 152 of the IC die 104, and coupled to functional circuitry 206 residing in the die circuitry 106 of the IC die 104.

A power node 302 is defined within one of the dielectric interconnection layer 118 or the IPD layer 116, for example using conductive posts 122 and jumpers 124 to connect the IPD 102 to one of the pillars 120 or conductive post 174. The power node 302 is coupled to the die power contact pad 202 (which is connected to the functional circuitry 206 of the IC die 104), the package circuitry 182 and an IPD power terminal 216.

Similarly, a ground node 304 is within one of the dielectric interconnection layer 118 or the IPD layer 116, for example using conductive posts 122 and jumpers 124 to connect the IPD 102 to one of the pillars 120 or the conductive posts 174. The ground node 304 is coupled to the die ground contact pad 204 (which is connected to the functional circuitry 206 of the IC die 104), the package circuitry 182 and an IPD ground terminal 218.

Similar to the example depicted in FIG. 2 and described above, the IPD power and ground terminals 216, 218 shown in FIG. 3 are coupled to opposite plates forming the decoupled capacitor of the IPD 102. The IPD power and ground terminals 216, 218 are coupled in parallel to the functional circuitry 206 of the IC die 104. Thus, the IPD 102 functions to provide voltage stable power to the functional circuitry 206 of the IC die 104. Additionally, as the IPD 102 is immediately proximate the IC die 104, and connected to the functional circuitry 206 of the IC die 104 without having to be routed through the circuitry 182 of the package substrate 128, the performance of the IC die 104 is enhanced.

Figure 4:
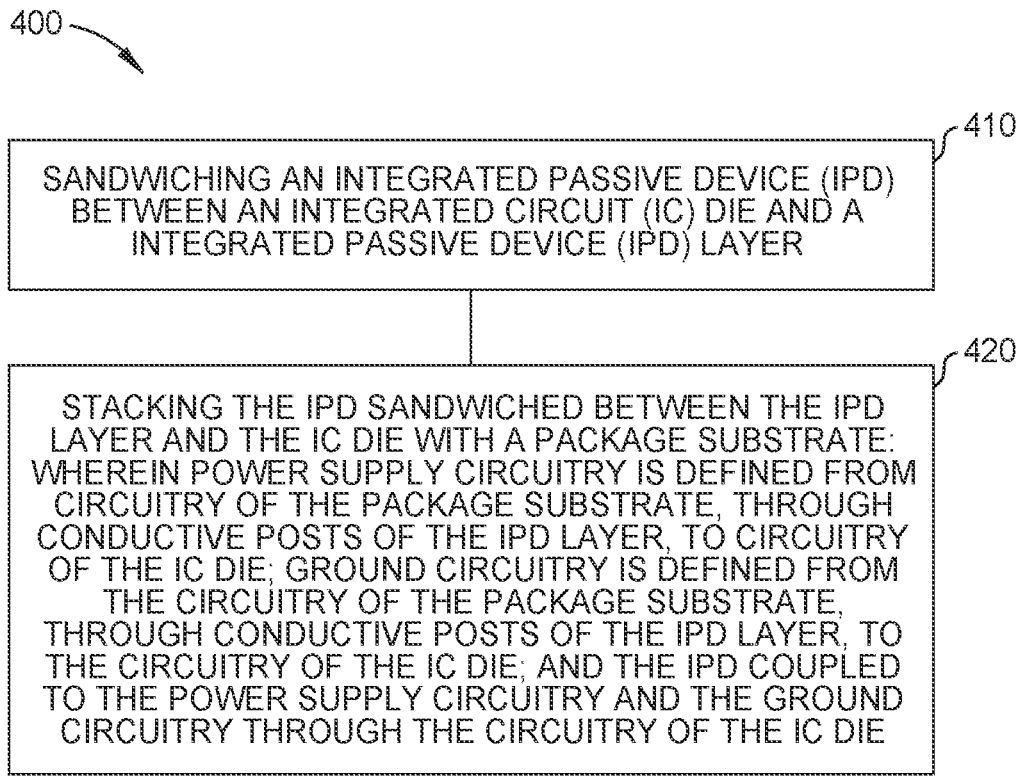
FIG. 4 is a flow diagram of a method for fabricating a chip package having an integrated passive device (IPD) disposed between an integrated circuit (IC) die and a package substrate.

FIG. 4 is a flow diagram of a method 400 for fabricating a chip package 100 having an integrated passive device (IPD) 102, an integrated circuit (IC) die 104, an integrated passive device (IPD) layer 116, a dielectric interconnection layer 118, and a package substrate 128. The method 400 may also be utilized for fabricate other chip packages that include an IPD 102 disposed between an IC die 104 and a package substrate 128.

The method 400 begins at operation 410 by sandwiching an IPD 102 between an IC die 104 and an IPD layer 116. The IPD 102 may be connected to the IC die 104 before or after the IPD 102 is coupled to the IPD layer 116. In one example when sandwiching the IPD 102 between the IC die 104 and the IPD layer 116, the IPD routings 176 are directly coupled to the IC die 104 without passing through the IPD layer 116. In another example when sandwiching the IPD 102 between the IC die 104 and the IPD layer 116, the IPD routings 176 are indirectly coupled to the IC die 104 by first passing through the IPD layer 116 or other layer below the IPD 102 to the IC die 104. From the end of the pillars 110 contacting the IC die 104, to the end of the conductive posts 174 exposed through the bottom surface 160 of the IPD layer 116, the electric routing coupled to the IC die 104 does not include a fanout.

During one example of operation 410, the IPD 102 may be first coupled to the IC die 104 prior to being sandwiched by the IPD layer 116. During another example of operation 410, the IPD 102 may be first coupled to the IPD layer 116 prior to being sandwiched against the IC die 104.

During one example of operation 410, the IPD 102 may be disposed completely between the top surface 158 of the IPD layer 116 and the IC die 104. During another example of operation 410, the IPD 102 may be disposed at least partially in a space 126 formed in the IPD layer 116, such that a portion of the IPD 102 is overlapped with the top surface 158 of the IPD layer 116. During yet another example of operation 410, the IPD 102 may be completely disposed in the space 126 formed in the dielectric interconnection layer 118, such that the entire IPD 102 is overlapped with the dielectric interconnection layer 118 below the DL top surface 162.

At operation 420, the stacked assembly comprising the IC die 104 and the IPD layer 116 is stacked with a package substrate 128. The stacking of the IPD layer 116 and the package substrate 128 at operation 420 may occur before or after the IPD sandwiching operation 410. At operation 420, pillars 120 of the dielectric interconnection layer 118 are electrically and mechanically coupled to the package circuitry 182. After the pillars 120 are coupled to the package circuitry 182 of the package substrate 128, underfill material 198 is dispensed between the pillars 120 to form the dielectric interconnection layer 118.

After completion of operations 410, 420, power supply circuitry is defined from the circuitry 182 of the package substrate 128, through the pillars 120, 174 of the dielectric interconnection layer 118 and the IPD layer 116, to the circuitry 106 of the IC die 104. Similarly, ground circuitry is defined from the circuitry 182 of the package substrate 128, through the pillars 120, 174 of the dielectric interconnection layer 118 and the IPD layer 116, to the circuitry 106 of the IC die 104. Although not shown in FIG. 3, the power and ground circuitries pass through the pillars 110 when passing between the IPD layer 116 and the IC die 104.

Additionally after completion of operations 410, 420, the IPD 102 is coupled to the power supply circuitry and the ground circuitry formed though the circuitry of the chip package 100. In one example, the power and ground terminals 216, 218 of the IPD 102 are coupled to the power supply circuitry and the ground circuitry directly to the IC die 104 without passing through the pillars 120 of the dielectric interconnection layer 118 or the package substrate 128. In another example, the power and ground terminals 216, 218 of the IPD 102 are coupled to the power supply circuitry and the ground circuitry within the dielectric interconnection layer 118 and/or IPD layer 116 using jumpers as described above, prior to connecting to the IC die 104. From the end of the pillars 110 contacting the IC die 104, to the end of the pillars 120 of the dielectric interconnection layer 118, the electric routing coupled to the IC die 104 does not include a fanout.

Although process flow of the method 400 depicts the IPD 102 as a decoupling capacitor coupled in parallel to the functional circuitry 206 of the IC die 104 as part of a power delivery network, the method 400 may be utilized to form chip packages having other types of IPDs. For example, the IPD 102 may not be connected to a power delivery network, and the IPD 102 may simply be connected to the functional circuitry 206 of the IC die 104 without being connected to the pillars 120 of the dielectric interconnection layer 118 or package substrate 128 in parallel or outside of the functional circuitry 206 of the IC die 104.

Figure 5:
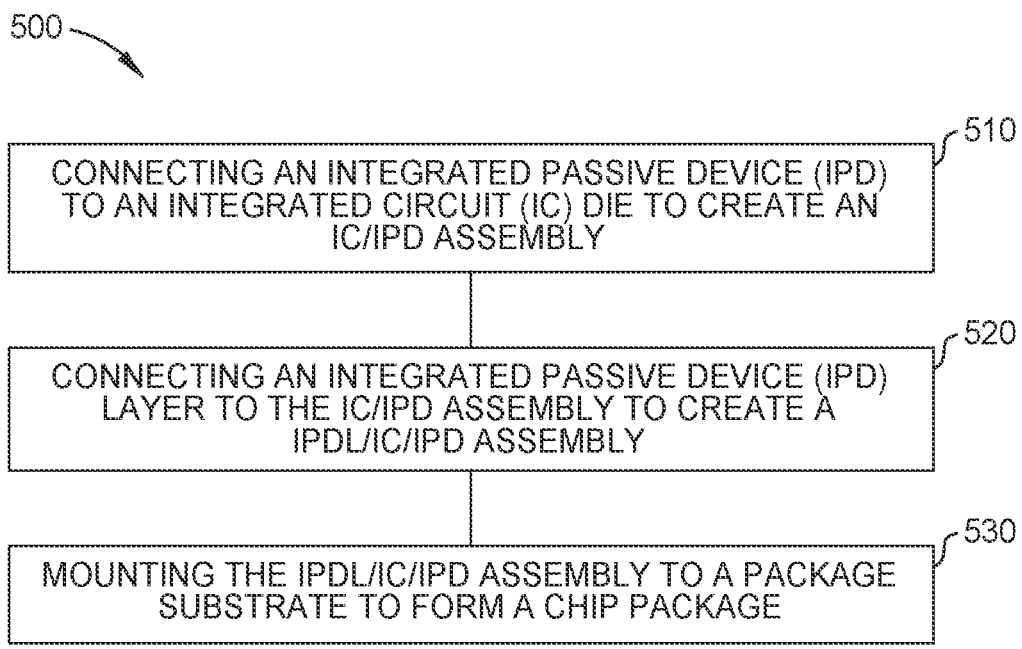
FIG. 5 is another flow diagram of a method for fabricating a chip package having an integrated passive device (IPD) disposed between an integrated circuit (IC) die and a package substrate.

FIG. 5 is another flow diagram of a method 500 for fabricating a chip package having an integrated passive device (IPD) 102 disposed between an integrated circuit (IC) die 104 and a dielectric interconnection layer 118. The method 500 may also be utilized for fabricate other chip packages that include an IPD 102 disposed between an IC die 104 and a package substrate 128.

The method 500 begins at operation 510 by connecting an IPD 102 to an IC die 104 to create an IC/IPD assembly. Connecting the IPD 102 to the IC die 104 includes connecting the terminals 216, 218 of the IPD 102 to the circuitry 106 of the IC die 104. In one example, the terminals 216, 218 of the IPD 102 are soldered, diffusion bonded or otherwise electrically and mechanically connected to the contact pads 202, 204 of the IC die 104 by the pillars 110 of the under die layer 108 that are formed in electrical communication with the contact pads 202, 204 of the IC die 104.

After connecting the IPD 102 to the IC die 104, an IPD layer 116 may be disposed around the IPD 102. After the IPD layer 116 is coupled to the IC die 104, underfill material 112 is dispensed between the IPD layer 116 and the IC die 104 to surround the pillars 110 and complete the under die layer 108. The underfill material 112 may also enhance the connection between the IPD 102 and the IC die 104. When necessary, the bottom surface 160 of the IPD layer 116 is planarized to better allow the subsequent formation of the pillars 120 of the dielectric interconnection layer 118 on the conductive posts 174. The conductive posts 174 are disposed through the dielectric material 172 can electrically and mechanically connected to the pillars 110. In one example, the conductive posts 174 are plated on the pillars 110.

In an alternative example, the IPD 102 may be mechanically connected to the IC die 104. In such an example, the terminals 216, 218 of the IPD 102 may be later connected to the circuitry 106 of the IC die 104 through the dielectric interconnection layer 118 and/or IPD layer 116, for example utilizing jumpers, at a later operation.

At operation 520, the dielectric interconnection layer 118 is formed on the IC/IPD assembly to create a IPDL/IC/IPD assembly. Forming the dielectric interconnection layer 118 includes connecting a plurality of pillars 120 to the conductive posts 174. In one example, the pillars 120 are plated on the conductive posts 174. The pillars 120 of the dielectric interconnection layer 118 are coupled to the circuitry 114 (i.e., pillars 110) of the under die layer 108 via the conductive posts 174 such that the pillars 120 of the dielectric interconnection layer 118 are coupled is coupled to the circuitry 106 of the IC die 104. In one example, the pillars 120 of the dielectric interconnection layer 118 are coupled to the terminals 216, 218 of the IPD 102 through the circuitry 106 of the IC die 104.

Optionally, forming dielectric interconnection layer 118 may include creating a space 126 that receives at least a portion of the IPD 102.

In an alternative example where the IPD 102 is only mechanically connected to the IC die 104, the terminals 216, 218 of the IPD 102 are connected to the pillars 120 of the dielectric interconnection layer 118 when the dielectric interconnection layer 118 is formed on the IC/IPD assembly.

At operation 530, the IPDL/IC/IPD assembly is mounted to a package substrate 128 to form a chip package 100. Optionally, a redistribution layer maybe disposed between the IPDL/IC/IPD assembly and the package substrate 128 as illustrated in FIG. 1B. Mounting the package substrate 128 to the IPDL/IC/IPD assembly includes mechanically and electrically connecting the pillars 120 of the dielectric interconnection layer 118 to the circuitry 182 of the package substrate 128. The connection between the pillars 120 of the dielectric interconnection layer 118 to the circuitry 182 of the package substrate 128 may be soldered, diffusion bonded or otherwise electrically and mechanically connected to provide robust power, ground and date transfer between the circuitry 182 of the package substrate 128 and the circuitry 106 of the IC die 104.

Also at operation 530, underfill material 198 is dispensed between the IPD layer 116 and the package substrate 128 to surround the pillars 120 and complete the dielectric interconnection layer 118. The underfill material 112 may also enhance the connection between the package substrate 128 and the IPD layer 116.

At operation 530, an array of solder balls 140 may also be formed on the bottom surface 168 of the package substrate 128.

Figure 6:
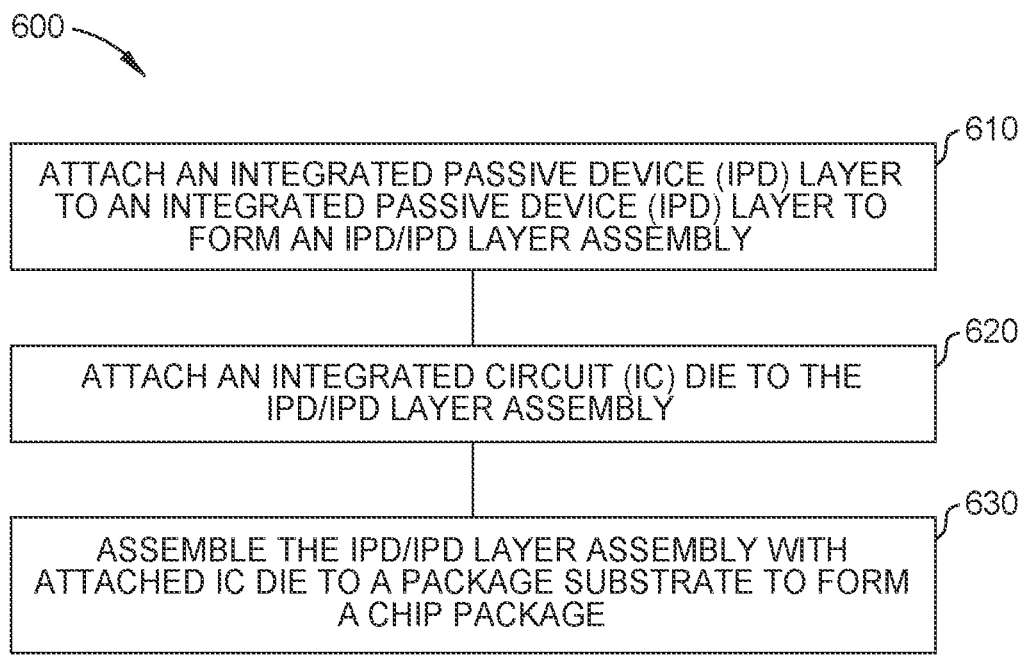
FIG. 6 is yet another flow diagram of a method for fabricating a chip package having an integrated passive device (IPD) disposed between an integrated circuit (IC) die and a package substrate.

FIG. 6 is yet another flow diagram of a method 600 for fabricating a chip package having an integrated passive device (IPD) 102 disposed between an integrated circuit (IC) die 104 and a dielectric interconnection layer 118. The method 500 may also be utilized for fabricate other chip packages that include an IPD 102 disposed between an IC die 104 and a package substrate 128.

The method 600 begins at operation 610 by attaching an IPD 102 to an IPD layer 116 to form IPD/IPD layer assembly. In IPD 102 may be secured to the IPD layer 116 using adhesives or other suitable technique.

At operation 620, an IC die 104 is attached to the IPD/IPD layer assembly. Attaching the IC die 104 to the IPD/IPD layer assembly includes electrically and mechanically coupling the pillars 110 extending from the IC die 104 to the conductive posts 174 residing in the IPD layer 116. After attaching IC die 104 to the IPD/IPD layer assembly, underfill material 112 may be dispensed between the IPD layer 116 and the IC die 104 to surround the pillars 110, thus forming an under die layer 108 with the pillars 110.

At operation 630, a package substrate 128 is assembled to the IPD/IPD layer assembly with attached the IC die 104. Assembling the IPD/IPD layer assembly to the package substrate 128 includes electrically and mechanically coupling the pillars 120 extending from the IPD/IPD layer assembly to the circuitry 182 of package substrate 128. After assembling the IPD layer 116 to the package substrate 128, underfill material 198 may be dispensed between the IPD layer 116 and the package substrate 128 to surround the pillars 120, thus forming a dielectric interconnection layer 118 with the pillars 120.

At operation 630, an array of solder balls 140 may also be formed on the bottom surface 168 of the package substrate.

Thus, a chip package and method for fabricating have been described that includes a near-die integrated passive device. Positioning the integrated passive device very close to the IC die avoids routing through fanouts, and improves communication speeds and reliability. Additionally, parasitic losses that occur in conventional routing of integrated passive devices to the IC die through the package substrate are eliminated. When used a part of a power delivery network, near-die integrated passive devices enable significant improvements in loop inductance and AC droop are realized.

While the foregoing is directed to embodiments of the present invention, other and further embodiments of the invention may be devised without departing from the basic scope thereof, and the scope thereof is determined by the claims that follow.

What is claimed is:

1. A chip package, comprising:
   an integrated circuit (IC) die;
   a package substrate having a die side and a ball side, the package substrate comprising:
      a core having a vias disposed therethrough;
      build-up layers having a first surface facing the IC die and a second surface disposed on the core; and
      package circuitry having routing terminating on the top and bottom surfaces of the package substrate, the routing passing through the vias and the build-up layers;
   an integrated passive device (IPD) layer having conductive posts coupled to pillars disposed below the IC die;
   a dielectric interconnection layer disposed between the IC die and the first surface of the build-up layers, the dielectric interconnection layer having conductive pillars coupled to and aligned with the conductive posts of the IPD layer; and
   an integrated passive device (IPD) disposed at least partially within the IPD layer, the IPD having at least one terminal electrically coupled to the IC die;
   wherein the conductive pillars disposed below the IC die, the conductive posts of the IPD layer, and the conductive pillars of the dielectric interconnection layer are linearly aligned with one another to provide straight electrical connections between the package substrate and the IC die, without fanout or re-distribution within the IPD layer and without fanout or re-distribution between the IPD layer and the IC die.

2. The chip package of claim 1, wherein the IPD comprises a resistor, a capacitor, an inductor, coil, balun, or an impedance matching element.

3. The chip package of claim 1, wherein the IPD is disposed within the IPD layer.

4. The chip package of claim 1, further comprising:
   a redistribution layer providing a fanout between the conductive posts of the IPD layer and the package substrate.

5. The chip package of claim 1, wherein the IPD comprises:
   a capacitor having first and second terminals coupled to circuitry of the IC die.

6. The chip package of claim 5, wherein the first and second terminals of the capacitor are coupled to the circuitry of the IC die without passing through the package substrate.

7. The chip package of claim 5, wherein the first and second terminals of the capacitor are coupled to the circuitry of the IC die without passing through the conductive pillars of the dielectric interconnection layer.

8. The chip package of claim 5, wherein the first terminal of the capacitor is coupled to the circuitry of the IC die through the conductive pillars of the dielectric interconnection layer.

9. The chip package of claim 8 further comprising:
   a decoupling capacitor coupled to the ball side of the package substrate, the decoupling capacitor coupled in parallel to the IPD.

10. The chip package of claim 1, wherein the IPD layer further comprises:
    a plurality of dummy posts disposed between the IPD and the package substrate configured to mitigate warpage of the chip package.

11. A chip package, comprising:
    an integrated circuit (IC) die having a plurality of pillars;
    a package substrate a die side and a ball side, the package substrate comprising:
       a core having a vias disposed therethrough;
       build-up layers having a first surface facing the IC die and a second surface disposed on the core; and
       package circuitry having routing terminating on top and bottom surfaces of the package substrate, the routing passing through the vias and the build-up layers and including a first fanout;
    an integrated passive device (IPD) layer having conductive posts coupled to the pillars of the IC die;
    a dielectric interconnection layer having conductive pillars coupled to the conductive posts of the IPD layer, the conductive pillars of the dielectric interconnection layer, the conductive posts of the IPD layer and the pillars of the dielectric interconnection layer being linearly aligned to provide straight electrical connections between the package substrate and the IC die without fanout or re-distribution within the IPD layer and without fanout or re-distribution between the IPD layer and the IC die; and
    an integrated passive device (IPD) disposed at least partially within the IPD layer, wherein the IPD comprises comprising: a capacitor having first and second terminals coupled to circuitry of the IC die.

12. The chip package of claim 11 further comprising:
    a redistribution layer providing a second fanout between the conductive posts of the IPD layer and the package substrate, the IPD coupled to the IC die without routing through the second fanout.

13. The chip package of claim 11, wherein the first and second terminals of the capacitor are coupled to the circuitry of the IC die without passing through the package substrate.

14. The chip package of claim 11, wherein the first and second terminals of the capacitor are coupled to the circuitry of the IC die through the conductive pillars of the dielectric interconnection layer and/or the conductive posts of the IPD layer.

15. The chip package of claim 11, wherein the first and second terminals of the capacitor are coupled to the circuitry of the IC die without passing through the dielectric interconnection layer.

16. The chip package of claim 11, wherein the dielectric interconnection layer further comprises:
   a plurality of dummy pillars disposed between the IPD and the package substrate configured to mitigate warpage of the chip package.

17. An apparatus, comprising:
   a package substrate;
   one or more patterned metal layers disposed above the package substrate;
   a dielectric interconnection layer disposed above the one or more patterned metal layers, comprising conductive pillars extending between and oriented perpendicular to upper and lower surfaces of the dielectric interconnection layer;
   an integrated passive device (IPD) layer disposed above the dielectric interconnection layer, comprising conductive posts extending between and oriented perpendicular to upper and lower surfaces of the IPD layer, wherein the conductive posts of the IPD layer are exposed through the upper surface of the IPD layer and positioned to mate with conductive pillars of an under die layer of in integrated circuit device; and
   an IPD disposed at least partially within the IPD layer and configured to connect to an integrated circuit die of the integrated circuit device via one or more of the conductive pillars of the under die layer;
   wherein the conductive pillars of the dielectric interconnection layer and the conductive posts of the IPD layer are linearly aligned with one another and with the conductive pillars of the under die layer to provide straight electrical connections between the one or more patterned metal layers and the IC die without fanout or re-distribution within the IPD layer and without fanout or re-distribution between the IPD layer and the IC die.

18. The apparatus of claim 17, wherein the one or more patterned metal layers comprise re-distribution wiring that comprises fanout wiring.

19. The apparatus of claim 17, wherein a portion of the IPD is exposed through the upper surface of the IPD layer.

20. The apparatus of claim 17, wherein the IPD is disposed within the IPD layer.

* * * * *